(12) United States Patent
Paniccia

(10) Patent No.: US 7,508,275 B1
(45) Date of Patent: Mar. 24, 2009

(54) INDIRECT ANALOG SYNTHESIZER UTILIZING DIRECT ANALOG FRACTIONAL FREQUENCY MULTIPLIER APPROACH

(75) Inventor: Joseph Paniccia, Bel Air, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 303 days.

(21) Appl. No.: 11/521,334

(22) Filed: Sep. 14, 2006

(51) Int. Cl.
*H03L 7/16* (2006.01)
(52) U.S. Cl. .............................. 331/16; 331/25; 455/260
(58) Field of Classification Search .................. 331/1 A, 331/2, 16–18, 25; 327/147–150, 156–159; 332/127; 360/51; 375/376; 455/260
See application file for complete search history.

(56) References Cited

U.S. PATENT DOCUMENTS 5,015,971 A * 5/1991 Taylor et al. .................. 331/16
6,356,597 B1 * 3/2002 Jackson et al. .............. 375/308

* cited by examiner

*Primary Examiner*—David Mis

(57) ABSTRACT

The present invention is an indirect analog synthesizer utilizing a direct analog fractional frequency multiplier approach. A fractional frequency multiplier produces a source that is injected into an offset loop of an indirect analog synthesizer. The fractional frequency multiplier utilizes a source and a combination of multipliers, dividers, and switches to generate and select among different frequencies. This direct analog approach eliminates step recovery diodes and sample loops from the frequency synthesizer. Switching speed of the direct analog portion is less than 100 nanoseconds. This increase in switching speed of the direct analog portion greatly improves the overall switching speed of the overall frequency synthesizer. Also, the fractional frequency multiplier has phase noise 20 dB better than a sampling loop. Better phase noise of the signal feeding the offset loop pushes optimum loop bandwidth of the offset loop higher, which also improves switching speed.

22 Claims, 8 Drawing Sheets

Sample of Attainable Output Frequencies Derived from Fixed 1 GHz Input

40⇘

| Output Freq (MHz) | xN | /M |
|---|---|---|
| 20 | 5 | 250 |
| 25 | 5 | 200 |
| 30 | 6 | 200 |
| 35 | 7 | 200 |
| 40 | 6 | 150 |
| 50 | 5 | 100 |
| 60 | 6 | 100 |
| 70 | 7 | 100 |
| 100 | 5 | 50 |
| 125 | 5 | 40 |
| 150 | 6 | 40 |
| 200 | 5 | 25 |
| 250 | 5 | 20 |
| 300 | 6 | 20 |
| 350 | 7 | 20 |
| 400 | 6 | 15 |
| 500 | 5 | 10 |
| 600 | 6 | 10 |
| 700 | 7 | 10 |
| 750 | 6 | 8 |
| 1000 | 5 | 5 |
| 1250 | 5 | 4 |
| 1500 | 6 | 4 |
| 1750 | 7 | 4 |
| 2000 | 6 | 3 |
| 2500 | 5 | 2 |
| 3000 | 6 | 2 |
| 3500 | 7 | 2 |

FIG. 4

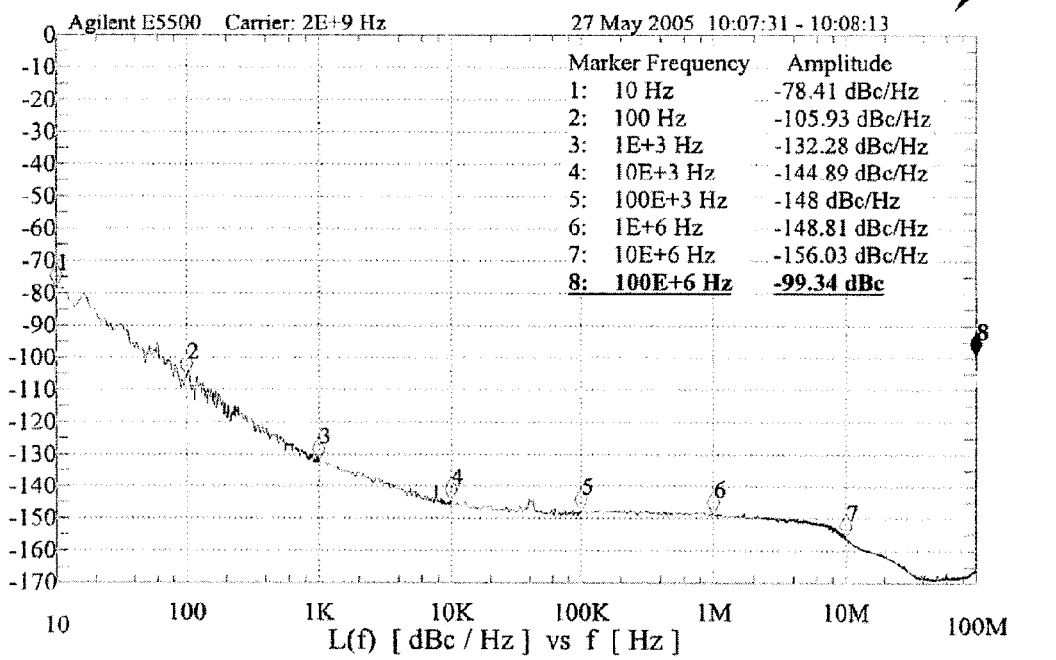

2 Low Noise 2 G source
Measurement time: 27 May 2005 10:07:31 - 10:08:13
Measurement type: Absolute phase noise (using a phase locked loop)
Start offset frequency: 10 Hz
Stop offset frequency: 100E+6 Hz
Minimum number of FFT averages: 4
Carrier Source frequency: 2E+9 Hz
Detector input frequency: 2E+9 Hz
Detector: Test set microwave phase detector
Nominal VCO tune constant: 200 Hz/Volt
VCO center voltage: 3.1 Volts
VCO tune range: 5 Volts
Detector constant cal method: Derive from measured beatnote.
Detector constant: 146.8E-3 V/Rad
VCO tune constant cal method: Measure the Tune Constant.
Current VCO tune constant: 201.3 Hz/Volt
PLL Integrator attenuation: 0 dB
Phase Locked Loop suppression was verified.
Closed PLL BW: 191.86 Hz
Peak Tune Range: 1.0014E+3 Hz
Assumed Pole: 2.148E+3 Hz
Carrier Source: (manual)
Reference Source: (manual) ; VCO tuned using EFC.

Time Base: (none)
Downconverter: (none)
LNA gain: 42 dB
Software Version: A.03.00

FIG. 6

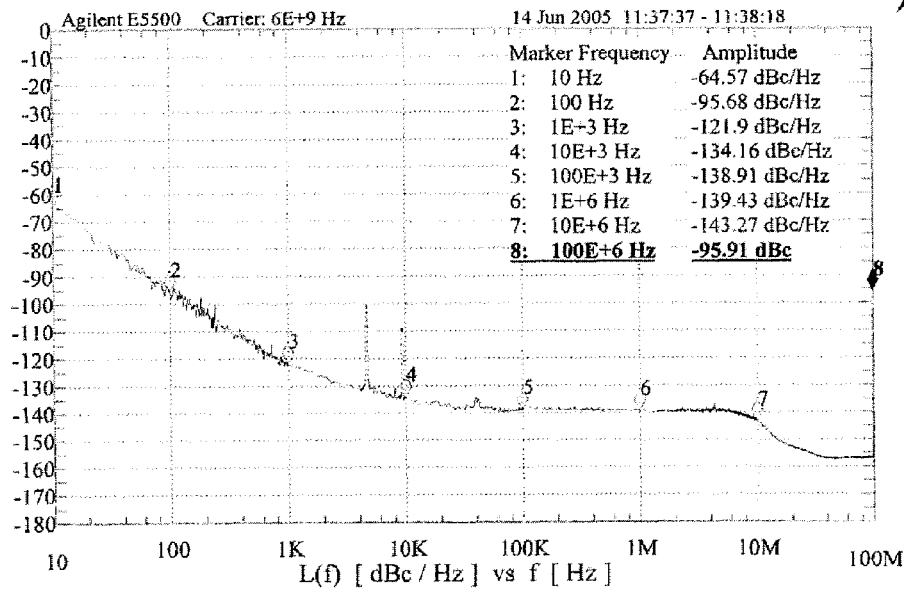

Measured 6GHz Phase Noise (FFM)

2 Low Noise 6G source

| Marker | Frequency | Amplitude |
|---|---|---|
| 1: | 10 Hz | -64.57 dBc/Hz |
| 2: | 100 Hz | -95.68 dBc/Hz |
| 3: | 1E+3 Hz | -121.9 dBc/Hz |
| 4: | 10E+3 Hz | -134.16 dBc/Hz |
| 5: | 100E+3 Hz | -138.91 dBc/Hz |
| 6: | 1E+6 Hz | -139.43 dBc/Hz |
| 7: | 10E+6 Hz | -143.27 dBc/Hz |
| 8: | 100E+6 Hz | -95.91 dBc |

2 Low Noise 6G source
Measurement time: 14 Jun 2005  11:37:37 - 11:38:18
Measurement type: Absolute phase noise (using a phase locked loop)
Start offset frequency: 10 Hz
Stop offset frequency: 100E+6 Hz
Minimum number of FFT averages: 4
Carrier Source frequency: 6E+9 Hz
Detector input frequency: 6E+9 Hz
Detector: Test set microwave phase detector
Nominal VCO tune constant: 600 Hz/Volt
VCO center voltage: 2.6 Volts
VCO tune range: 5 Volts
Detector constant cal method: Derive from measured beatnote.
Detector constant: 124.5E-3 V/Rad
VCO tune constant cal method: Use the current Tune Constant.
Current VCO tune constant: 608.3 Hz/Volt
PLL Integrator attenuation: 0 dB
Phase Locked Loop suppression was verified.
Closed PLL BW: 491.6 Hz
Peak Tune Range: 2.6782E+3 Hz
Assumed Pole: 2.108E+3 Hz
Carrier Source: (manual)
Reference Source: (manual) ; VCO tuned using EFC.

Time Base: (none)
Downconverter: (none)
LNA gain: 42 dB
Software Version: A.03.00

INDIRECT ANALOG SYNTHESIZER UTILIZING DIRECT ANALOG FRACTIONAL FREQUENCY MULTIPLIER APPROACH

FIELD OF THE INVENTION

The present invention relates generally to synthesizers and more particularly to an indirect analog synthesizer utilizing a direct analog fractional frequency multiplier approach.

BACKGROUND OF THE INVENTION

Frequency synthesizers may be employed in a variety of applications, including radio receivers, radio telephones, mobile telephones, portable telephones, walkie-talkies, CB radios, satellite receivers, GPS systems, navigation systems, wireless networking systems and the like. Frequency synthesizers may be employed to provide an output signal with a variable frequency dependent upon a frequency of an input signal. Performance of many devices which employ frequency synthesizers, such as receivers, may be dependent upon the performance of the frequency synthesizer. For example, frequency synthesizers which operate quickly and create minimal phase noise (rapid, short-term random fluctuations in the phase of a wave, caused by time domain instabilities) perform optimally.

Analog frequency synthesizers may be direct or indirect. Indirect analog frequency synthesizers use analog voltage controlled oscillators as the primary frequency generating device. By comparing the output frequency of the voltage controlled oscillator with a stable reference an error signal is produced to precisely control the output frequency. Direct analog frequency synthesizers utilize multiple RF techniques to translate and multiply reference frequencies to a desired frequency range. Essentially, an output is selected by means of high-speed switching among different constantly generated frequencies.

Conventional applications of ultra low phase noise indirect analog synthesizers employ a plurality of loops to keep the multiplier value (N) low. Conventional synthesizers may incorporate step recovery diodes or sampling detectors to create a low noise source to inject in an offset loop.

However, step recovery diodes and sampling detectors are not ideal multipliers. Additionally, loops containing step recovery diodes and sampling detectors have to be steered to the right comb (a set of frequency harmonics) so that the loop locks to the proper frequency. This adds complexity to the synthesizer. Additionally, multiple loops add to the latency of the synthesizer since the main loop must wait for settling of the other loops before the main loop may settle on a frequency. Consequently, replacing step recovery diodes or sampling detectors with simpler and faster components having better phase noise performance would be desirable.

SUMMARY OF THE INVENTION

Accordingly, the present invention is directed to an indirect analog synthesizer utilizing a direct analog fractional frequency multiplier approach. A fractional frequency multiplier utilizes a source and a combination of multipliers, dividers, and switches to generate and select among different frequencies. A fractional frequency multiplier is utilized instead of step recovery diodes or sample loops to generate a source. The source is injected into an offset loop of an indirect analog synthesizer to provide a fast low noise synthesizer.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 4 is a chart illustrating output frequencies derived from a fixed 1 GHz input utilizing the direct analog fractional frequency multiplier of FIG. 3 in accordance with an exemplary embodiment of the present invention;

FIG. 6 is a graph illustrating the measured phase noise of a 2 GHz fractional frequency multiplier in accordance with an exemplary embodiment of the present invention;

FIG. 7 is a graph illustrating the measured phase noise of a 6 GHz fractional frequency multiplier in accordance with an exemplary embodiment of the present invention.

DETAILED DESCRIPTION OF THE INVENTION

Reference will now be made in detail to exemplary embodiments of the invention, examples of which are illustrated in the accompanying drawings.

Figure 1:
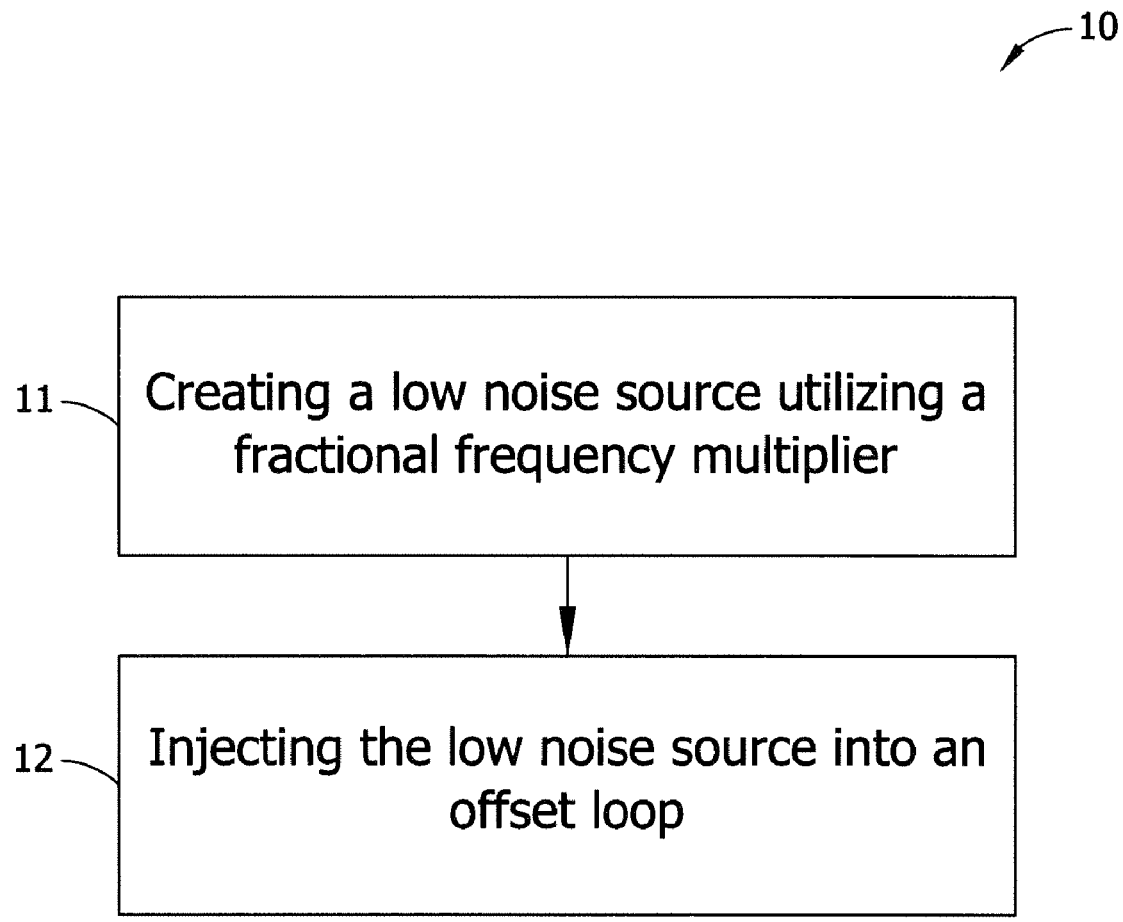
FIG. 1 is a flowchart illustrating a method of practicing an exemplary embodiment of the present invention.
Figure 2:
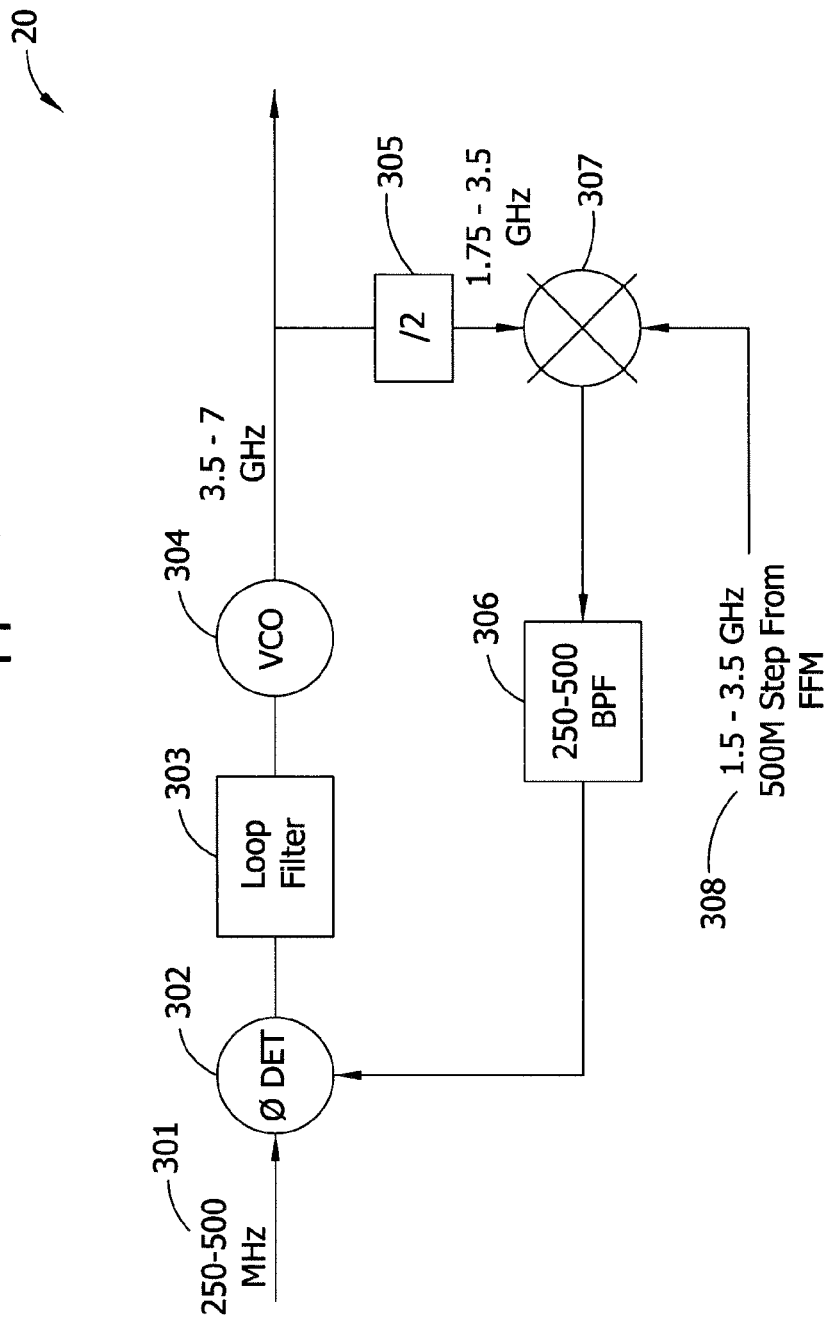
FIG. 2 is a block diagram illustrating the application of a fractional frequency multiplier in an indirect analog synthesizer an in accordance with an exemplary embodiment of the present invention.

Referring generally to FIGS. 1 and 2; an exemplary embodiment of an indirect analog synthesizer using a direct analog fractional frequency multiplier in accordance with the present invention is shown. The indirect analog synthesizer may be an ultra low noise indirect analog synthesizer.

Referring now to FIG. 1, a method 10 of utilizing a direct analog fractional frequency multiplier in an indirect analog synthesizer in accordance with an exemplary embodiment of the present invention is shown. In step 11, a fractional frequency multiplier is utilized to create a source. The source may be a low noise source. In step 12, the source is then injected into an offset loop.

Referring now to FIG. 2, the application 20 of a direct analog fractional frequency multiplier in an indirect analog synthesizer in accordance with an exemplary embodiment of the present invention is shown. The fractional frequency multiplier is utilized to create a source 308 which is then injected into an offset loop. The source 308 may be a low noise source. The source 308 may be a 1.5-3.5 GHz source. The offset loop of the indirect analog synthesizer will now be described. The offset loop input 301 feeds a signal into the first input of the phase detector 302. The signal may be a 250-500 MHz signal. The phase detector 302 output feeds into the loop filter 303 input. The loop filter 303 output feeds into the voltage controlled oscillator 304 input. The voltage controlled oscillator 304 output feeds a signal into the offset loop output and the frequency divider 305 input. The signal may be a 3.5-7 GHZ signal. The frequency divider 305 may be a /2 frequency divider. The frequency divider 305 output feeds into the first input of the mixer 307. The source 308 feeds into the second input of the mixer 307. The source 308 may be a low noise source. The source 308 may be a 1.5-3.5 GHz source. The mixer 307 output feeds into the band pass filter 306 input and the band pass filter 306 output feeds into the second input of the phase detector 302. The band pass filter 306 may pass frequencies in the range between 250 MHz-500 MHz and reject frequencies outside that range.

Figure 3:
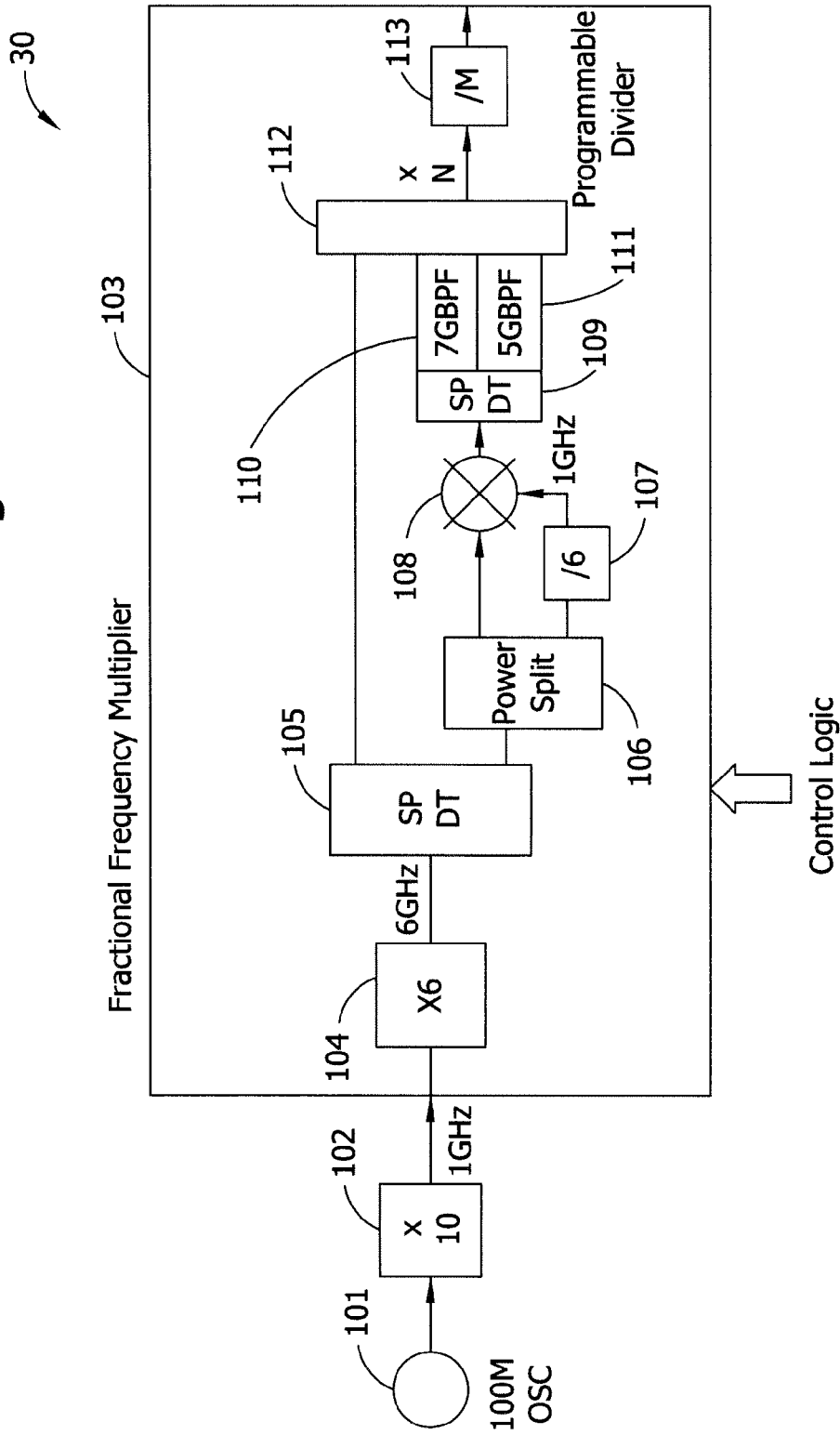
FIG. 3 is a block diagram illustrating a direct analog fractional frequency multiplier in accordance with an exemplary embodiment of the present invention.

Referring now to FIG. 3, a direct analog fractional frequency multiplier 30 in accordance with an exemplary embodiment of the present invention is shown. The direct analog fractional frequency multiplier will now be described. A source is fed into the frequency multiplier 104 input. The source may be a low noise source. The source may be a 1 GHz source. The frequency multiplier 104 may be a low noise frequency multiplier. The frequency multiplier 104 may be a X6 multiplier. The source may be composed of an oscillator 101 which feeds into a frequency multiplier 102. The oscillator 101 may be a 100 MHz oscillator. The frequency multiplier 102 may be a X10 frequency multiplier. The frequency multiplier 104 output feeds into the first switch 105 input. The first switch 105 may be a SPDT (single pole, double throw) switch. The first output of the first switch 105 feeds into the first input of second switch 112. The second switch 112 may be a three-way switch. The second output of the first switch 105 feeds into the power splitter 106 input. The power splitter 106 may be a two-way power splitter. The first output of the power splitter 106 feeds into the first input of the mixer 108. The second output of the power splitter 106 feeds into the frequency divider 107 input. The frequency divider 107 may be a /6 frequency divider. The frequency divider 107 output feeds into the second input of the mixer 108. The mixer 108 output feeds into the third switch 109. The third switch 109 may be a SPDT switch. The first output of the third switch 109 feeds into the first band pass filter 110 input. The second output of the third switch 109 feeds into the second band pass filter 111 input. The first band pass filter 110 may pass frequencies in the 7 GHz range and reject frequencies outside the 7 GHz range. The second band pass filter 111 may pass frequencies in the 5 GHz range and reject frequencies outside the 5 GHz range. The first band pass filter 110 output feeds into the second input of the second switch 112. The second band pass filter 111 output feeds into the third input of the second switch 112. The second switch 112 output feeds into the programmable divider 113 input. FIG. 4 illustrates a list 40 of sample output frequencies obtainable utilizing the direct analog fractional frequency multiplier of FIG. 3.

Figure 5:
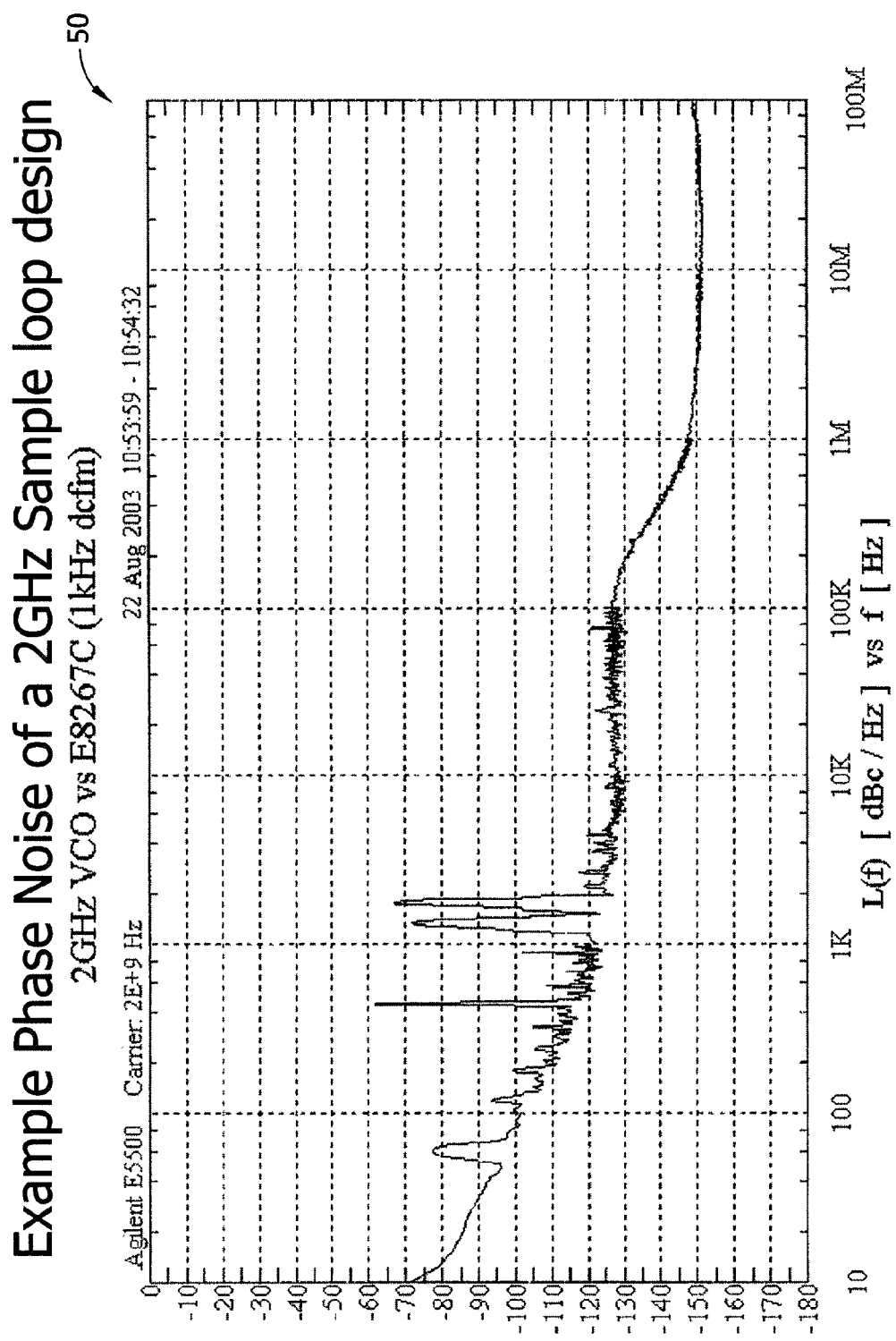
FIG. 5 is a graph illustrating the measured phase noise of a 2 GHz sample loop design, as is known in the art.
Figure 8:
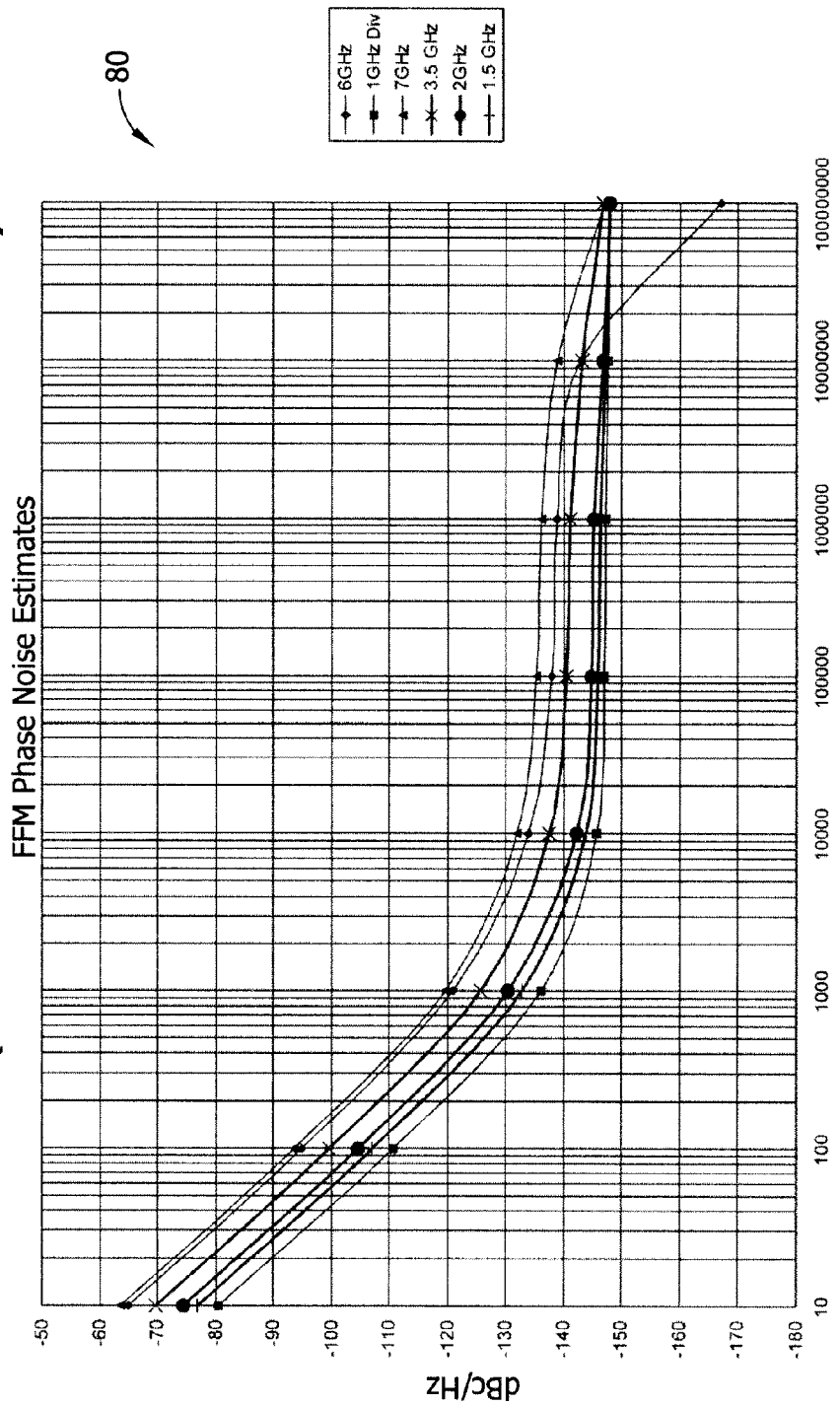
FIG. 8 is a graph illustrating the estimated phase noise of various frequency outputs (based on the measured results of FIG. 7) of a fractional frequency multiplier in accordance with an exemplary embodiment of the present invention.

Referring generally to FIGS. 5-8, the advantages of the present invention are illustrated. Referring now to FIGS. 5 and 6, the phase noise 50 and 60 of a 2 GHz direct analog fractional frequency multiplier in accordance with an exemplary embodiment of the present invention is 20 dB better than that of a 2 GHz sample loop. Also, because a direct analog approach is utilized, switching speed is under 100 nanoseconds. Referring now to FIG. 7, the measured phase noise 70 for a direct analog fractional frequency multiplier (in accordance with an exemplary embodiment of the present invention) with a 6 GHz output is illustrated. Referring now to FIG. 8, phase noise estimates 80 (based on the 6 GHZ measured results of FIG. 7) for various frequency outputs of a direct analog fractional frequency multiplier (in accordance with an exemplary embodiment of the present invention) are illustrated.

While the offset loop and direct analog fractional frequency multiplier have been described, it is contemplated that other configurations and other components may be employed without departing from the scope and intent of the present invention. For example, the low noise source for the direct analog fractional frequency multiplier could be a 2 GHz signal. Additionally, other frequencies can be generated without departing from the scope and intent of the present invention.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An indirect analog synthesizer comprising:
an offset loop;
a source, injected into the offset loop;
a fractional frequency multiplier;
wherein the fractional frequency multiplier creates the source, the fractional frequency multiplier comprises:
a source fractional frequency multiplier input;
a frequency multiplier with an input and an output;
a first switch with an input and a first and second output;
a power splitter with an input and a first and second output;
a mixer with a first input, a second input, and an output,
a frequency divider with an input and an output;
a filter bank with an input and two outputs;
a second switch with a first input, a second input, a third input and an output; and
a programmable frequency divider;
wherein the source fractional frequency multiplier input feeds into the frequency multiplier input, the frequency multiplier output feeds into the first switch input, the first output of the first switch feeds into the first input of the second switch, the second output of the first switch feeds into the power splitter input, the first output of the power splitter feeds into the first input of the mixer, the second output of the power splitter feeds into the frequency divider input, the frequency divider output feeds into the second input of the mixer, the mixer output feeds into the filter bank input, the first output of the filter bank feeds into the second input of the second switch, the second output of the filter bank feeds into the third input of the second switch, the filter bank being operable to select between an upper sideband and a lower sideband, and the second switch output feeds into the programmable divider input.

2. The indirect analog synthesizer as claimed in claim 1 wherein the two section filter bank comprises:
a switch with an input and a first and second output;
a first band pass filter with an input and an output;
and a second band pass filter with an input and an output;
wherein the first output of the switch feeds into the first band pass filter input, the second output of the switch feeds into the second band pass filter input, the first band pass filter passing frequencies in the upper sideband range and rejecting frequencies outside the upper sideband range, and the second band pass filter passing frequencies in the lower sideband range and rejecting frequencies outside the lower sideband range.

3. The indirect analog synthesizer as claimed in claim 1 wherein the source fractional frequency multiplier input comprises:
an oscillator with an output; and
a frequency multiplier with an input and an output;
wherein the oscillator output feeds into the frequency multiplier input.

4. The indirect analog synthesizer as claimed in claim 3 wherein, the oscillator is a 100 MHz oscillator, the frequency multiplier of the source fractional frequency multiplier input is a X10 multiplier, the frequency multiplier of the fractional frequency multiplier is a X6 multiplier, the first switch is a SPDT switch, the second switch is a three-way switch, the power splitter is a two-way power splitter, the filter bank is a two section filter bank, the frequency divider is a /6 divider, the upper sideband being 7 GHz, and the lower sideband being 5 GHz.

5. The indirect analog synthesizer as claimed in claim 1 wherein offset loop comprises:
an offset loop input;
an offset loop output;
a phase detector with a first input, a second input, and an output;
a loop filter with an input and an output;
a voltage controlled oscillator with an input and an output;
a frequency divider with an input and an output;
a mixer with a first input, a second input, and an output;
a band pass filter with an input and an output; and
a source input;
wherein the offset loop input feeds into the first input of the phase detector, the phase detector output feeds into the loop filter input, the loop filter output feeds into the voltage controlled oscillator input, the voltage controlled oscillator output feeds into the offset loop output and the frequency divider input, the frequency divider output feeds into the first input of the mixer, the source input feeds into the second input of the mixer, the mixer output feeds into the band pass filter input, and the band pass filter output feeds into the second input of the phase detector.

6. The indirect analog synthesizer as claimed in claim 5 wherein,
the offset loop input is between 250 and 500 MHz, the fractional frequency multiplier output is between 1.5 and 3.5 GHz, the frequency divider is a /2 divider, and the band pass filter passes frequencies ranging between 250 and 500 MHz and rejects frequencies outside that range.

7. An indirect analog synthesizer comprising:
an offset loop;
a source, injected into the offset loop;
a fractional frequency multiplier;
wherein the fractional frequency multiplier creates the source, wherein the fractional frequency multiplier comprises:
an oscillator with an output;
a first frequency multiplier with an input and an output;
a second frequency multiplier with an input and an output;
a first switch with an input and a first and second output;
a power splitter with an input and a first and second output;
a mixer with a first input, a second input, and an output;
a frequency divider with an input and an output;
a first band pass filter with an input and an output;
a second band pass filter with an input and an output;
a second switch with a first input, a second input, a third input and an output;
a third switch with an input and a first and second output; and
a programmable frequency divider;
wherein the oscillator output feeds into the first frequency multiplier input, the first frequency multiplier output feeds into the second frequency multiplier input, the second multiplier output feeds into the first switch input, the first output of the first switch feeds into the first input of the second switch, the second output of the first switch feeds into the power splitter input, the first output of the power splitter feeds into the first input of the mixer, the second output of the power splitter feeds into the frequency divider input, the frequency divider output feeds into the second input of the mixer, the mixer output feeds into the third switch input, the first output of the third switch feeds into the first band pass filter input, the second output of the third switch feeds into the second band pass filter input, the first band pass filter output feeds into the second input of the second switch, the second band pass filter output feeds into the third input of the second switch, the first band pass filter passing an upper sideband range and rejecting anything outside the upper sideband range, the second band pass filter passing a lower sideband range and rejecting anything outside the lower sideband range, and the second switch output feeds into the programmable divider input.

8. The indirect analog synthesizer as claimed in claim 7 wherein,
the oscillator is a 100 MHz oscillator, the first frequency multiplier is a X10 multiplier, the second frequency multiplier is a X6 multiplier, the first switch is a SPDT switch, the second switch is a three-way switch, the third switch is a SPDT switch, the power splitter is a two-way power splitter, the filter bank is a two section filter bank, the frequency divider is a /6 divider, the upper sideband being 7 GHz, and the lower sideband being 5 GHz.

9. The indirect analog synthesizer as claimed in claim 7 wherein offset loop comprises:
an offset loop input;
an offset loop output;
a phase detector with a first input, a second input, and an output;
a loop filter with an input and an output;
a voltage controlled oscillator with an input and an output;
a frequency divider with an input and an output;
a mixer with a first input, a second input, and an output;
a band pass filter with an input and an output; and
a source input;
wherein the offset loop input feeds into the first input of the phase detector, the phase detector output feeds into the loop filter input, the loop filter output feeds into the voltage controlled oscillator input, the voltage controlled oscillator output feeds into the offset loop output and the frequency divider input, the frequency divider output feeds into the first input of the mixer, the source input feeds into the second input of the mixer, the mixer output feeds into the band pass filter input, the band pass filter output feeds into the second input of the phase detector, the offset loop input is between 250 and 500 MHz, the source input created by the fractional frequency multiplier is between 1.5 and 3.5 GHz, the frequency divider is a /2 divider, and the band pass filter passes frequencies ranging between 250 and 500 MHz and rejects frequencies outside that range.

10. A fractional frequency multiplier comprising:
a source fractional frequency multiplier input;
a frequency multiplier with an input and an output;
a first switch with an input and a first and second output;
a power splitter with an input and a first and second output;
a mixer with a first input, a second input, and an output;
a frequency divider with an input and an output;
a filter bank with an input and two outputs;
a second switch with a first input, a second input, a third input and an output; and
a programmable frequency divider;
wherein the source fractional frequency multiplier input feeds into the frequency multiplier input, the frequency multiplier output feeds into the first switch input, the first output of the first switch feeds into the first input of the second switch, the second output of the first switch feeds into the power splitter input, the first output of the power splitter feeds into the first input of the mixer, the second output of the power splitter feeds into the frequency divider input, the frequency divider output feeds into the second input of the mixer, the mixer output feeds into the filter bank input, the first output of the filter bank feeds into the second input of the second switch, the second output of the filter bank feeds into the third input of the second switch, the filter bank being operable to select between an upper sideband and a lower sideband, and the second switch output feeds into the programmable divider input.

11. The fractional frequency multiplier as claimed in claim 10 wherein the two section filter bank comprises:
a switch with an input and a first and second output;
a first band pass filter with an input and an output;
and a second band pass filter with an input and an output;
wherein the first output of the switch feeds into the first band pass filter input, the second output of the switch feeds into the second band pass filter input, the first band pass filter passing frequencies in the upper sideband range and rejecting frequencies outside the upper sideband range, and the second band pass filter passing frequencies in the lower sideband range and rejecting frequencies outside the lower sideband range.

12. The fractional frequency multiplier as claimed in claim 10 wherein the source fractional frequency multiplier input comprises:
an oscillator with an output; and
a frequency multiplier with an input and an output;
wherein the oscillator output feeds into the frequency multiplier input.

13. The fractional frequency multiplier as claimed in claim 12 wherein,
the oscillator is a 100 MHz oscillator, the frequency multiplier of the source fractional frequency multiplier input is a X10 multiplier, the frequency multiplier of the fractional frequency multiplier is a X6 multiplier, the first switch is a SPDT switch, the second switch is a three-way switch, the power splitter is a two-way power splitter, the filter bank is a two section filter bank, the frequency divider is a /6 divider, the upper sideband being 7 GHz, and the lower sideband being 5 GHz.

14. A method of improving switching speed and reducing phase noise in an indirect analog synthesizer comprising:
creating a source utilizing a fractional frequency multiplier; and
injecting the source into an offset loop, wherein the fractional frequency multiplier comprises:
a source fractional frequency multiplier input;
a frequency multiplier with an input and an output;
a first switch with an input and a first and second output;
a power splitter with an input and a first and second output;
a mixer with a first input, a second input, and an output;
a frequency divider with an input and an output;
a filter bank with an input and two outputs;
a second switch with a first input, a second input, a third input and an output; and
a programmable frequency divider;
wherein the source fractional frequency multiplier input feeds into the frequency multiplier input, the frequency multiplier output feeds into the first switch input, the first output of the first switch feeds into the first input of the second switch, the second output of the first switch feeds into the power splitter input, the first output of the power splitter feeds into the first input of the mixer, the second output of the power splitter feeds into the frequency divider input, the frequency divider output feeds into the second input of the mixer, the mixer output feeds into the filter bank input, the first output of the filter bank feeds into the second input of the second switch, the second output of the filter bank feeds into the third input of the second switch, the filter bank being operable to select between an upper sideband and a lower sideband, and the second switch output feeds into the programmable divider input.

15. The method as claimed in claim 14 wherein the two section filter bank comprises:
a switch with an input and a first and second output;
a first band pass filter with an input and an output; and
a second band pass filter with an input and an output;
wherein the first output of the switch feeds into the first band pass filter input, the second output of the switch feeds into the second band pass filter input, the first band pass filter passing frequencies in the upper sideband range and rejecting frequencies outside the upper sideband range, and the second band pass filter passing frequencies in the lower sideband range and rejecting frequencies outside the lower sideband range.

16. The method as claimed in claim 14 wherein the source fractional frequency multiplier input comprises:
an oscillator with an output; and
a frequency multiplier with an input and an output;
wherein the oscillator output feeds into the frequency multiplier input.

17. The method as claimed in claim 16 wherein,
the oscillator is a 100 MHz oscillator, the frequency multiplier of the source fractional frequency multiplier input is a X10 multiplier, the frequency multiplier of the fractional frequency multiplier is a X6 multiplier, the first switch is a SPDT switch, the second switch is a three-way switch, the power splitter is a two-way power splitter, the filter bank is a two section filter bank, the frequency divider is a /6 divider, the upper sideband being 7 GHz, and the lower sideband being 5 GHz.

18. The method as claimed in claim 14 wherein offset loop comprises:
an offset loop input,
an offset loop output,
a phase detector with a first input, a second input, and an output;
a loop filter with an input and an output;
a voltage controlled oscillator with an input and an output;
a frequency divider with an input and an output;
a mixer with a first input, a second input, and an output;
a band pass filter with an input and an output; and a source input;

wherein the offset loop input feeds into the first input of the phase detector, the phase detector output feeds into the loop filter input, the loop filter output feeds into the voltage controlled oscillator input, the voltage controlled oscillator output feeds into the offset loop output and the frequency divider input, the frequency divider output feeds into the first input of the mixer, the source input feeds into the second input of the mixer, the mixer output feeds into the band pass filter input, and the band pass filter output feeds into the second input of the phase detector.

19. The method as claimed in claim 18 wherein, the offset loop input is between 250 and 500 MHz, the fractional frequency multiplier output is between 1.5 and 3.5 GHz, the frequency divider is a /2 divider, and the band pass filter passes frequencies ranging between 250 and 500 MHz and rejects frequencies outside that range.

20. A method of improving switching speed and reducing phase noise in an indirect analog synthesizer comprising:

creating a source utilizing a fractional frequency multiplier; and injecting the source into an offset loop, wherein the fractional frequency multiplier comprises:

an oscillator with an output;
a first frequency multiplier with an input and an output;
a second frequency multiplier with an input and an output;
a first switch with an input and a first and second output;
a power splitter with an input and a first and second output;
a mixer with a first input, a second input, and an output;
a frequency divider with an input and an output;
a first band pass filter with an input and an output;
a second band pass filter with an input and an output;
a second switch with a first input, a second input, a third input and an output;
a third switch with an input and a first and second output; and
a programmable frequency divider;

wherein the oscillator output feeds into the first frequency multiplier input, the first frequency multiplier output feeds into the second frequency multiplier input, the second frequency multiplier output feeds into the first switch input, the first output of the first switch feeds into the first input of the second switch, the second output of the first switch feeds into the power splitter input, the first output of the power splitter feeds into the first input of the mixer, the second output of the power splitter feeds into the frequency divider input, the frequency divider output feeds into the second input of the mixer, the mixer output feeds into the third switch input, the first output of the third switch feeds into the first band pass filter input, the second output of the third switch feeds into the second band pass filter input, the first band pass filter output feeds into the second input of the second switch, the second band pass filter output feeds into the third input of the second switch, the first band pass filter passing an upper sideband range and rejecting anything outside the upper sideband range, the second band pass filter passing a lower sideband range and rejecting anything outside the lower sideband range, and the second switch output feeds into the programmable divider input.

21. The method as claimed in claim 20 wherein, the oscillator is a 100 MHz oscillator, the first frequency multiplier is a X10 multiplier, the second frequency multiplier is a X6 multiplier, the first switch is a SPDT switch, the second switch is a three-way switch, the third switch is a SPDT switch, the power splitter is a two-way power splitter, the filter bank is a two section filter bank, the frequency divider is a /6 divider, the upper sideband being 7 GHz, and the lower sideband being 5 GHz.

22. The method as claimed in claim 20 wherein offset loop comprises:

an offset loop input;
an offset loop output;
a phase detector with a first input, a second input, and an output;
a loop filter with an input and an output;
a voltage controlled oscillator with an input and an output;
a frequency divider with an input and an output;
a mixer with a first input, a second input, and an output;
a band pass filter with an input and an output; and
a source input;

wherein the offset loop input feeds into the first input of the phase detector, the phase detector output feeds into the loop filter input, the loop filter output feeds into the voltage controlled oscillator input, the voltage controlled oscillator output feeds into the offset loop output and the frequency divider input, the frequency divider output feeds into the first input of the mixer, the output of the source input feeds into the second input of the mixer, the mixer output feeds into the band pass filter input, the band pass filter output feeds into the second input of the phase detector, the offset loop input is between 250 and 500 MHz, the source input created by the fractional frequency multiplier is between 1.5 and 3.5 GHz, the frequency divider is a /2 divider, and the band pass filter passes frequencies ranging between 250 and 500 MHz and rejects frequencies outside that range.

* * * * *